US010275942B2

(12) United States Patent
Tuffreau

(10) Patent No.: US 10,275,942 B2
(45) Date of Patent: Apr. 30, 2019

(54) COMPRESSION OF A THREE-DIMENSIONAL MODELED OBJECT

(71) Applicant: Dassault Systemes, Velizy Villacoublay (FR)

(72) Inventor: Jean Julien Tuffreau, Le Plessis Robinson (FR)

(73) Assignee: Dassault Systemes, Velizy Villacoublay (FR)

( * ) Notice: Subject to any disclaimer, the term of this patent is extended or adjusted under 35 U.S.C. 154(b) by 0 days.

(21) Appl. No.: 15/374,259

(22) Filed: Dec. 9, 2016

(65) Prior Publication Data
US 2017/0091997 A1 Mar. 30, 2017

Related U.S. Application Data

(63) Continuation of application No. 14/340,300, filed on Jul. 24, 2014, now Pat. No. 9,536,349.

(30) Foreign Application Priority Data

Jul. 30, 2013 (EP) .................................... 13306101

(51) Int. Cl.
G06F 17/50 (2006.01)
G06T 17/20 (2006.01)
(Continued)

(52) U.S. Cl.
CPC ............ *G06T 17/205* (2013.01); *G06F 17/50* (2013.01); *G06T 1/60* (2013.01); *G06T 7/60* (2013.01);
(Continued)

(58) Field of Classification Search
None
See application file for complete search history.

(56) References Cited

U.S. PATENT DOCUMENTS 5,808,617 A * 9/1998 Kenworthy ........... G06T 11/001
345/421
7,355,600 B2 4/2008 Baraff
(Continued)

FOREIGN PATENT DOCUMENTS

CN 101872485 10/2010
CN 102930597 10/2010

OTHER PUBLICATIONS

European Search Report for EP Patent Application No. 13306101.0, "Compression of a Three-Dimensional Modeled Object," dated Feb. 4, 2014 (9 pages).
(Continued)

Primary Examiner — Said Broome
(74) Attorney, Agent, or Firm — Hamilton, Brook, Smith & Reynolds, P.C.

(57) ABSTRACT

It is proposed a computer-implemented method for compressing a three-dimensional modeled object. The method comprises: providing a mesh of the three-dimensional modeled object; parameterizing (u,v) the mesh in a two-dimensional plane, the parameterization of the mesh resulting in a set of vertices having two-dimensional coordinates; providing a grid on the two-dimensional plane; and modifying the two-dimensional coordinates of each vertex by assigning one vertex to one intersection of the grid. Such compression method is lossless, completely reversible, suitable to efficiently reduce the storage size of a CAD file.

19 Claims, 5 Drawing Sheets

(51) Int. Cl.
*H04N 19/20* (2014.01)
*G06T 1/60* (2006.01)
*G06T 7/60* (2017.01)

(52) U.S. Cl.
CPC .............. *G06T 17/20* (2013.01); *H04N 19/20* (2014.11); *G06T 2200/04* (2013.01)

(56) References Cited

U.S. PATENT DOCUMENTS

| | | | |
|---|---|---|---|
| 9,536,349 B2 | 1/2017 | Tuffreau | |
| 2008/0106547 A1* | 5/2008 | Kataoka | G06T 17/20 345/420 |
| 2009/0040224 A1* | 2/2009 | Igarashi | G06T 19/00 345/427 |
| 2010/0271371 A1* | 10/2010 | Chang | G06T 17/00 345/427 |

OTHER PUBLICATIONS

Kose, K., et al., "3D Model compression using Connectivity-Guided Adaptive Wavelet Transform built into 2D SPIHT," *J. Vis. Commun. Image R.*, vol. 21, 17028 (2010).

Kose, K., et al., "Nonrectangular Wavelets for Multiresolution Mesh Analysis and Compression," Signal Processing and Communications Applications, 2006 IEEE 14$^{th}$ Antalya Turkey Apr. 17-19, 2006, Piscataway, NJ, USA, IEEE, Apr. 17, 2006 (4 pages).

Wantanabe, S., et al., "Triangular Mesh Geometry Coding with Multiresolution Decomposition Based on Structuring of Surrounding Vertices," Signal Processing and Information Technolgy, 2008, ISSPIT 2008. IEEE Internal Symposium on IEEE, Piscataway, NJ, USA, Dec. 16, 2008, pp. 396-401.

Wantanabe, S., et al., "Multiresolution Decomposition for Triangular Mesh Geometry Coding Based on Structuring Surrounding Vertices," Image Processing (ICIP), 2009 16$^{th}$ IEEE International Conference on IEEE, Piscataway, NJ, USA, Nov. 7, 2009, pp. 3505-3508.

Katsura, Y., et al. "Skin-off: Texture-oriented 2-D Plane Mapping for 3-D Video Compression", The Journal of The Institute of Image Information and Television Engineers, vol. 60, No. 4, pp. 553-560, The Institute of Image Information and Television Engineers, Japan, Apr. 1, 2006.

* cited by examiner

COMPRESSION OF A THREE-DIMENSIONAL MODELED OBJECT

RELATED APPLICATION(S)

This application is a continuation of U.S. application Ser. No. 14/340,300, filed Jul. 24, 2014, which claims priority under 35 U.S.C. § 119 or 365 to Europe, Application No. 13306101.0, filed Jul. 30, 2013. The entire teachings of the above applications are incorporated herein by reference.

FIELD OF THE INVENTION

The invention relates to the field of computer programs and systems, and more specifically to a method, system and program for compressing/uncompressing a three-dimensional modeled.

BACKGROUND OF THE INVENTION

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In the field of computer graphics, the surface of a 3D object is often represented by a collection of triangles (or more generally by a collection of polygons) in a 3D space. These polygons are connecting vertices which hold different properties. Among these different properties each vertex has at least a definite position in space (x, y and z). This kind of representation is called a polygonal mesh. It is also called a triangular mesh if the representation only contains triangles. A polygonal mesh can be divided in two types of data: (i) geometry data comprise the whole set of positions and other properties for each vertex, and (ii) connectivity data comprise the indices of the vertices joined by each polygon.

3D objects and surface geometries of 3D objects can be stored on a persistent support in a straightforward implementation, i.e. without compression. This straightforward storage (i.e. without compression) is notably used in CATIA and in other CAD software. With such a storing, the storing is lossless. Indeed, the data defining the model is not modified before storing, and there can therefore not be any loss of data. The storing is also stable. Indeed, the data defining the model is not to be transformed when the model is reopened, because the data is not compressed. However, such a method fails to optimize the storage size of a CAD model.

To this aims, several compression schemes have been developed. Remeshing is one of the techniques that can be used for storing 3D objects while requiring considerably less storage space on the storage. Surface geometry is often modeled with irregular triangle meshes. The process of remeshing refers to approximating such geometry using a mesh with (semi)-regular connectivity.

Xiangfeng Gu, Steven Gortler and Hugues Hoppe (Geometry images. In *Proceedings of the 29th annual conference on Computer graphics and interactive techniques*, pages 355-361. ACM Press, 2002) introduce another representation called geometry image and a process to convert a 3D model a polygonal mesh into an image called geometry image. A geometry image is a completely regular structure wherein the surface of the 3D object is represented by a grid of vertices. Each vertex is connected to four neighbors except at the grid borders. Hence, a geometry image may be contemplated as a 2D array of vertices, like a raster image which is a two-dimensional array of colored pixels. Going further into the comparison, the geometry image may be seen as a two-dimensional image where each pixel hold in their color channels (red, green, blue) the positions x, y and z of a sampled point on the surface of the tridimensional object. To serialize a geometry image, one only have to store the properties of each vertex (geometry data), because the connectivity is implicit (a vertex is connected to its four neighbors in the geometry image).

Geometry image representation is sometimes referred to in some online virtual worlds as sculpted prims. Geometry image is notably suitable for this kind of application due to the ease to operate with it (modeling) and the efficiency to compress and transfer it over the network. This representation is also recognized by some modelers.

The process to convert a polygonal mesh into a geometry image is called remeshing. It consists in finding a convenient 2D parameterization for the object surface that is represented by a polygonal mesh and then in sampling new points on this surface regularly spaced in the 2D parameterization space. According to the building process, these new points form a regular grid, which is the geometry image representation. Consequences of the remeshing process are:

there is no guarantee that the new sampled points match with those of the initial polygonal mesh, and it almost never happens;

connectivity data of the initial mesh is completely lost, and there is no way to know how initial vertices were connected by looking at the resulting geometry image; and depending on the 2D parameterization and the distance between two sampled points, some details in the initial polygonal mesh can disappear in the resulting geometry image. Said otherwise, the surface made by joining the regularly sampled points may slightly differ from the original surface due to the building process. This effect can be attenuated if the number of sampling points is increased, but this also increases the size of the geometry image.

Another limitation is that models which are not watertight, which have high topology genus or which are not manifold, can require additional calculations to find a convenient 2D parameterization at the beginning of the process. This can lead to the need of much more vertices in the geometry image than in the initial polygonal mesh to describe correctly the same surface. In the worse situation, this can even lead to the inability to find a solution.

To sum up, the process of remeshing is irreversible in the sense it is not possible recover the initial polygonal mesh from the geometry image. At the most, the representation obtained from the geometry image is very similar to the initial polygonal mesh, but both representations do not necessarily match in terms of Hausdorff distance. In addition, the geometry image represents a surface close to the initial mesh but always with few errors: loss of small details, distortions. Furthermore, non-watertight initial mesh can lead to a geometry image that needs more data for describing the object than the polygonal mesh.

Within this context, there is still a need for an improved compression method which is lossless and completely reversible, and that is suitable to efficiently reduce the storage size of a CAD file.

SUMMARY OF THE INVENTION

According to one aspect, the invention therefore provides a computer-implemented method for compressing a three-dimensional modeled object. The method comprises:
  providing a mesh of the three-dimensional modeled object;
  parameterizing (u,v) the mesh in a two-dimensional plane, the parameterization of the mesh resulting in a set of vertices having two-dimensional coordinates;
  providing a grid on the two-dimensional plane; and
  modifying the two-dimensional coordinates of each vertex by assigning one vertex to one intersection of the grid.

The method may comprise one or more of the following:
  after providing the mesh of the three-dimensional modeled object: storing connectivity data of the mesh of the three-dimensional modeled object;
  assigning one vertex to one intersection of the grid is performed by a repulsion technique that pushes each vertex away from another;
  the repulsion technique comprises comparing the distance between two vertices with the length of the grid cell diagonal; and pushing the two vertices away if the distance between the two is lower than the length (L);
  several iterations of the repulsion technique are performed until there is at most only one vertex between four intersections of the grid;
  after performing a repulsion technique, performing a relaxation technique that eliminates empty intersections between vertices;
  the size of the grid is extendable;
  the set of vertices having modified two-dimensional coordinates forms a raster image, wherein each vertex of the set is a pixel of the raster image and the coordinate (x, y, z) of each vertex of the set is stored in the color channels red/blue/green of the raster image;
  supplementary properties of the vertices of the set are stored in additional color channels;
  the raster image is reframed for reducing the size of the raster image;
  applying on the set of vertices having modified two-dimensional coordinates one of the following compression scheme: -a discrete cosine transform; -a wavelet transformations; and connectivity data of the mesh of the three-dimensional modeled object is compressed.

The invention further proposes a computer-implemented method for uncompressing a three-dimensional modeled compressed according to the above method. The method comprises:
  providing the set of vertices having modified two-dimensional coordinates;
  extracting the vertices from the provided set of vertices; and
  connecting the vertices with connectivity data.

The invention further proposes a computer-aided design system comprising:
  a database storing a mesh of a three-dimensional modeled object; and
  means for compressing three-dimensional modeled object according to the above compression method and/or for decompressing a three-dimensional modeled according to the above decompression method.

The invention further proposes a computer program or computer program product comprising instructions for execution by a computer, the instructions comprising means for performing the above compression method and/or decompression method.

The invention further proposes a computer readable storage medium having recorded thereon the above computer program.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments of the invention will now be described, by way of non-limiting example, and in reference to the accompanying drawings, where.

DETAILED DESCRIPTION OF THE INVENTION

A description of example embodiments of the invention follows.

The teachings of all patents, published applications and references cited herein are incorporated by reference in their entirety.

Figure 1:
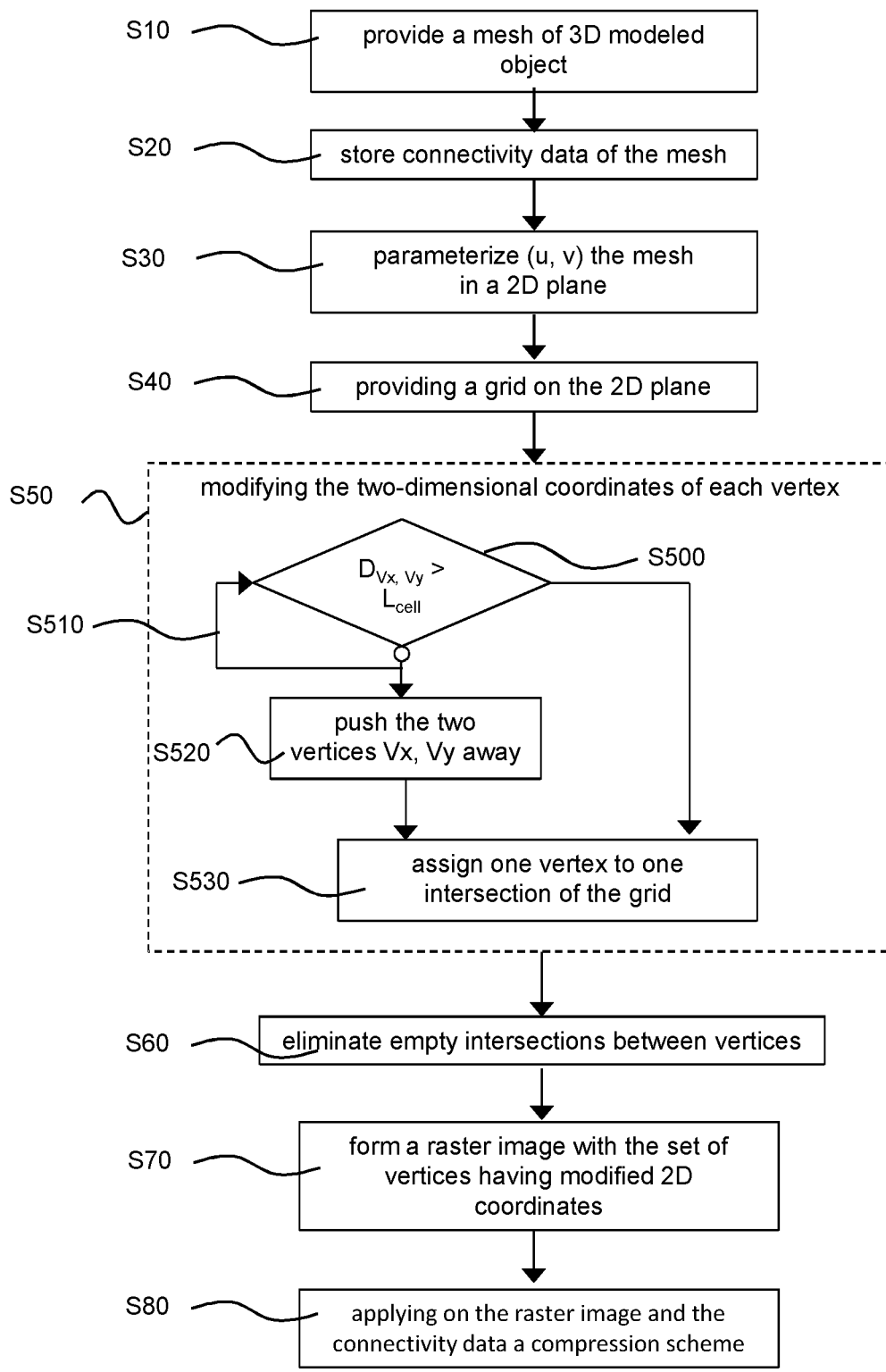
FIG. 1 shows a flowchart of an example of the method.

With reference to the flowchart of FIG. 1, it is proposed a computer-implemented method for compressing a three-dimensional (3D) modeled object. The method comprises providing a mesh of the three-dimensional modeled object. Then, the mesh is parameterized (u,v) in a two-dimensional (2D) plane. It results from the parameterization of the mesh a set of vertices having 2D coordinates. Next, a grid is provided on the two-dimensional plane. Then, the 2D coordinates of each vertex are modified. The modification of the 2D coordinates is performed by assigning one vertex to one intersection of the grid.

Such a method slightly modifies the definition of a geometry image disclosed in Xianfeng Gu, Steven J. Gortler, and Hugues Hoppe (Geometry images. In Proceedings of the 29th annual conference on Computer graphics and interactive techniques, pages 355-361. ACM Press, 2002) and provides an improved conversion of a polygonal mesh into 2D image representation. That is, the present method improves the compression of a 3D modeled object.

For the sake of explanation, it is reminded that a geometry image, as known in the art, is obtained from a transformation of an arbitrary surface of a 3D modeled object onto static mesh as a 2D image, which is a completely regular remesh of the original geometry of the 3D modeled object, and that support reverse transformation. The geometry image provides a completely regular structure that captures geometry as a simple 2D array of quantized points. Surface signals like normals and colors are stored in similar 2D arrays using the same implicit surface parameterization—texture coordinates are absent.

The result of the present method is a two-dimensional array of vertices which lie on the surface of the 3D object, but instead of sampling new points on the surface of the object at regular interval to get a grid of points, the original vertices are kept from the triangular mesh. This advantageously provides that any vertex hold by the two-dimensional array of vertices matches exactly a vertex from the initial polygonal mesh. Reciprocally, any vertex from the initial polygonal mesh matches exactly a vertex of the geometry image. Hence, it results that any vertex of the two-dimensional array of vertices has one exact corresponding vertex in the polygonal mesh, and therefore the process to convert a polygonal mesh into a geometry image is completely reversible. This involves that a 3D modeled object compressed with the present method can be uncompressed without losing small details as the conversion is lossless. In fact, any detail of the initial polygonal mesh can disappear in the resulting two-dimensional array of vertices because the present method of compression does not rely on a sampling of the parameterized mesh. By this way, there is no need to increase the number of sampling points, which increases the size of the geometry image. Hence, the present invention advantageously allow to improve compression rate of a mesh of 3D modeled object that contains details that would be lost using geometry image disclosed in Xianfeng Gu, Steven J. Gortler, and Hugues Hoppe. In addition, any 3D modeled object may converted because the present method does not require any condition on the closure or on the topology of the mesh of the 3D modeled object. Further advantages of the present invention will appear in the description.

The method is computer-implemented. This means that the steps (or substantially all the steps) of the method are executed by at least one computer. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined.

For instance, the step of providing a mesh of the 3D modeled object may be performed upon user action. For instance, the user may select a 3D modeled object into a dedicated menu or in a feature tree, e.g. the data 2500 in FIG.

A typical example of computer-implementation of the method is to perform the method with a system (e.g. a CAD system) comprising a memory storing 3D modeled objects, or at least meshes of 3D modeled objects. The memory, which stores a database, is merely any hardware suitable for such storage. The system may further comprise a graphical user interface (GUI). The GUI is coupled with a memory and a processor. The GUI may be adapted for displaying the provided mesh of the 3D modeled object. The system further comprises means for compressing three-dimensional modeled object according to the above method. The system may further comprise means for decompressing a three-dimensional modeled compressed according to the above method. Such a system allows the modeling of 3D modeled objects with low memory resources. Indeed, as the system compresses the 3D modeled object according to the efficient compressing method presented above, more objects may be stored under compressed form in the database of the system as compared to other systems. In addition, such a system improves the overall process of designing because detailed 3D modeled objects may be compressed without losing information when uncompressing said compressed 3D modeled object.

The graphical user interface may allow a user to command the compressing of data modeling an object or the decompressing of data modeling an object. The object may be a part, thus modeled by a CAD file. The system may thus store CAD files under compressed form, and decompress them when a designer needs to work on the part, for example by means of the graphical user interface.

By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

In the case of the method, the database can store data representative of 3D modeled objects, or at least meshes of 3D modeled objects.

The method generally manipulates meshes of 3D modeled objects. A modeled object is any object defined by data stored in the database. By extension, the expression "modeled object" designates the data itself. According to the type of the system, the modeled objects may be defined by different kinds of data.

The system may indeed be any combination of a CAD system, a CAE system, a CAM system, a PDM and/or a PLM system. In those different systems, modeled objects are defined by corresponding data. One may accordingly speak of CAD object, PLM object, CAE object, CAM object, CAD data, PLM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system suitable at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By product it is meant an item to be physically manufactured. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

A CAD system may be history-based. In this case, a modeled object is further defined by data comprising a history of geometrical features. A modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent. In practice, (B-rep) of parts are the means of describing the geometrical model to the mesher, the mesher outputting the mesh displayed.

By CAE (Computer-Aided Engineering) solution, it is meant any solution, software or hardware, suitable for the analysis of the physical behavior of modeled object. A well-known and widely used CAE technique is the Finite Element Method (FEM) which typically involves a division of a modeled objet into elements which physical behaviors can be computed and simulated through equations. Such CAE solutions are provided by Dassault Systemes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systemes under the trademark DYMOLA®.

By CAM (Computer-Aided Manufacturing) solution, it is meant any solution, software or hardware, suitable for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systemes under the trademark DELMIA®.

By PDM (Product Data Management) solution, it is meant any solution, software or hardware, suitable for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systemes under the trademark ENOVIA®.

Figure 13:
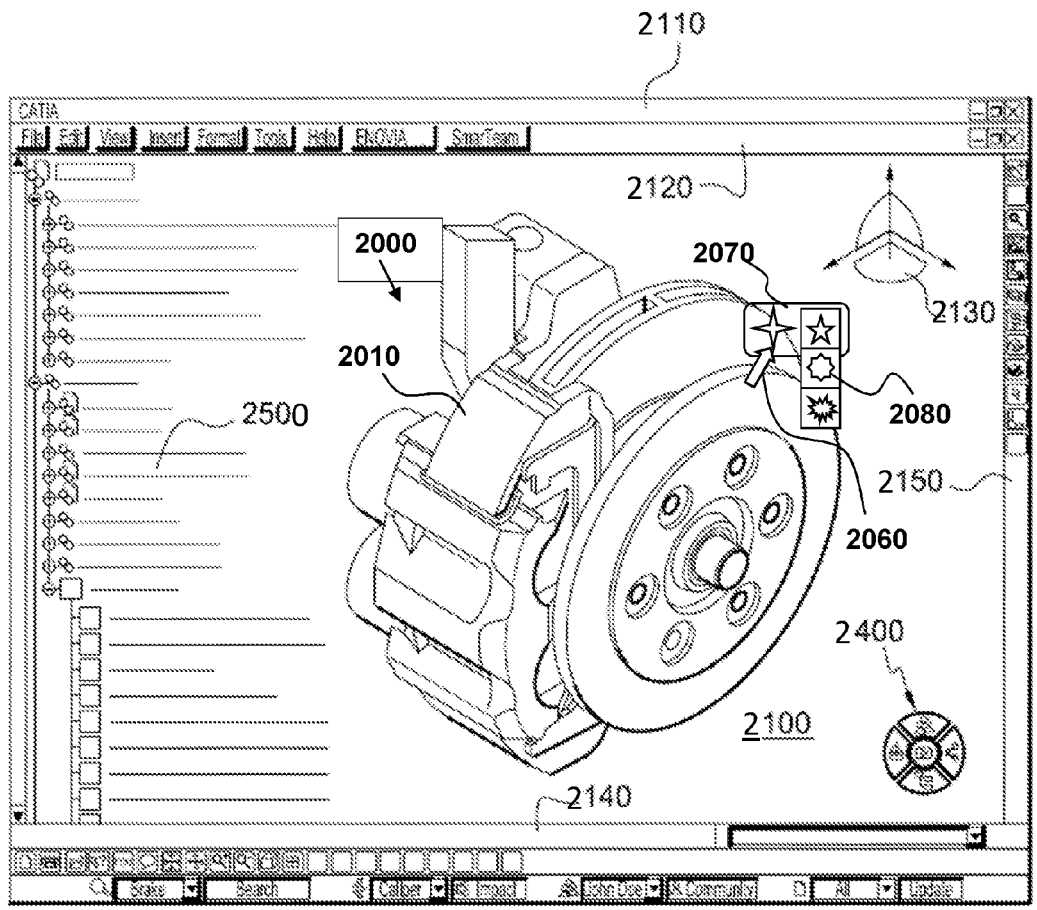
FIG. 13 shows an example of a graphical user interface of CAD system.

FIG. 13 shows an example of the GUI of the system, wherein the system is a CAD system.

The GUI 100 may be a typical CAD-like interface, having standard menu bars 110, 2120, as well as bottom and side toolbars 140, 2150. Such menu—and toolbars contain a set of user-selectable icons, each icon being associated with one or more operations or functions, as known in the art. Some of these icons are associated with software tools, adapted for editing and/or working on the 3D modeled object 2000 displayed in the GUI 100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

Figure 2:
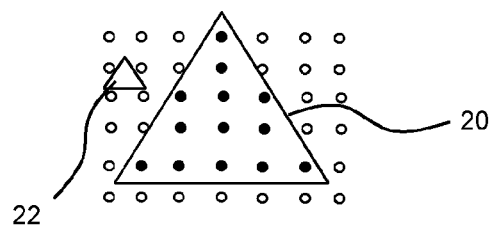
FIG. 2 shows an example of a sampling used in the prior art.

The GUI may for example display data 500 related to the displayed product 2000. In the example of FIG. 2, the data 500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 14:
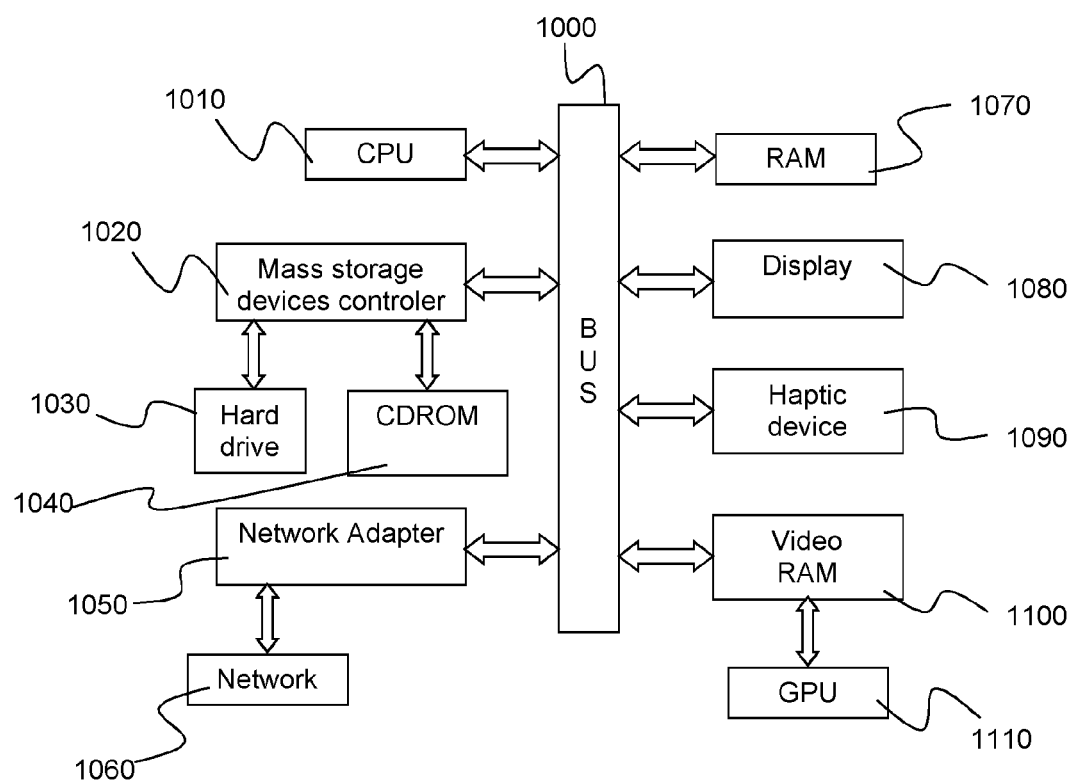
FIG. 14 shows an example of a CAD system.

FIG. 14 shows a computer system, e.g. a CAD system.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080, as mentioned with reference to FIG. 13. In addition, the cursor control device allows the user to select various commands, and input control signals. The cursor control device includes a number of signal generation devices for input control signals to system. Typically, a cursor control device may be a mouse, the button of the mouse being used to generate the signals. As another example, the display 1080 may be a sensitive touch display, and the cursor control may be performed upon user action (e.g. touch) on the touch sensitive display.

A computer program may comprise instructions by a computer, the instructions comprising means for causing the above system to perform the above method. The invention may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language.

Referring back to FIG. 1, it is now discussed an example of the method of the present invention.

At step S10, it is provided a mesh of 3D modeled object. This may be performed upon user action, e.g. the user selects a 3D modeled object that may be stored on a memory. This may also be automatically achieved by the computer system performing the method. Providing means that the mesh of the 3D modeled object is available to the computer system, that is, the system can access data relative to the mesh. Typically, the computer system may display the mesh of the 3D modeled object once it is available to the system, as presented for instance on FIG. 4 that shows the mesh of a 3D modeled object modeling a statue.

Then, at step S20, connectivity data of the mesh is stored. For instance, the connectivity data may be stored on the memory that stores the 3D mesh. Connectivity data comprise the indices of the vertices joined by each polygon of the mesh. Connectivity data thus identify, for each vertex of the mesh, the neighbor vertex (or vertices) that are connected to said each vertex of the mesh. Keeping connectivity data of the polygonal mesh advantageously facilitates the identification of the vertices which are close on the surface of the object because vertices are now not necessary close in the two-dimensional array, as explained below.

It is to be understood that the step S20 can be optional because the polygonal mesh provided at step S10 may be already divided into geometry data and connectivity data. Hence, in this case, the memory stores both geometry data and connectivity data, and therefore, connectivity data is available for further steps.

Next, at step S30, the mesh of the provided 3D modeled object is parameterized (u, v) in a two-dimensional plane. Parameterizing the mesh in a two-dimensional plane means that it is determined the parameters necessary for having a specification of the 3D modeled object in a 2D space. In practice, the parameterization comprises the identification of a complete set of effective coordinates (u, v) of each vertex of the mesh in the 2D plane. Parameterization is performed as known in the art, e.g. ABF++ parameterization algorithm may be used. For example this can be done so that the whole mesh may be unfold in the two-dimensional plane with less distortion or so that the mesh cut into a small number of charts may be unfold in the two-dimensional plane with less distortion.

Figure 4:
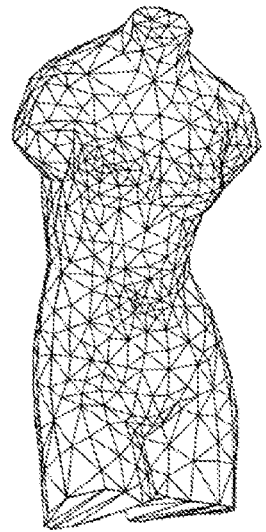
FIG. 4 shows an example of a polygonal mesh to be remeshed according to the invention.
Figure 5:
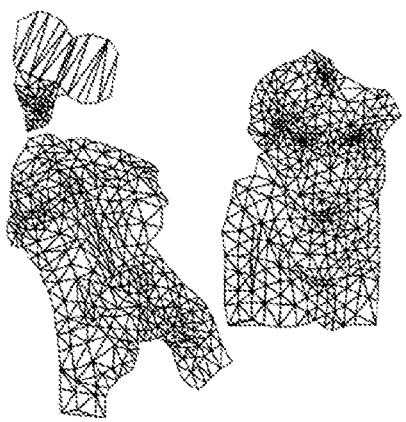
FIG. 5 shows an example of vertices of the polygonal mesh of FIG. 4 that are parameterized (u, v) in a two-dimensional plane.

FIG. 5 shows the mesh of FIG. 4 that have been parameterized in a 2D plane. The parameterization of the mesh results in a set of vertices having two-dimensional coordinates (u,v) in a 2D plane. Interestingly, each vertex of the original mesh of the 3D modeled object is represented by one vertex in the 2D plane.

Referring back to FIG. 1, at step S40, a grid is provided on the 2D plane. In practice, the grid is automatically provided, e.g. by the computer system. Providing a grid on the 2D plane means that a set of lines that cross each other is defined on the 2D plane. The lines intersect, thus providing a set of intersections on the 2D planes. In practice, the lines are uniformly spaced horizontal and perpendicular lines, so that the intersections are regularly placed on the 2D plane. This advantageously allows improving the construction of a two-dimensional array as it will be depicted in the following steps. It is to be understood that any configuration of the lines may be used.

The number of intersections of the grid is at least equal to the number of vertices of the parameterized mesh. In practice, the number of intersections is slightly bigger than the number of vertices of the mesh.

Interestingly, the size of the grid may be extendable. Extending the grid means that the number of lines that cross each other can be increased, thus increasing the number of intersections of the grid. In practice, the extension of the grid is performed by adding new lines at the edges of the grid. Said otherwise, the density of vertices of the grid is not increased. Inversely, the size of the grid may be shorten, that is, one or more lines of the grid may be removed.

In practice, the step S40 may be performed before the parameterization of the mesh of the 3D modeled object is done. Typically, the grid is added on the 2D plane, and then the parameterization is carried out. Then, after that the parameterization of the mesh has occurred, the size of the grid may be dynamically changed (e.g. extended) in response to the result of the parameterization: indeed, it generally results from the parameterization of the mesh a non-uniform distribution of the resulting set of vertices. For instance, lines may be added on the edge of the grid close to a zone of the 2D plane wherein the density of vertices of the parameterized mesh is the most important. This may advantageously improve the efficiency of the further next S50.

Each intersection on the 2D plane has also a coordinate (u, v) in the 2D plane. The coordinate of the intersection may be defined by using the same referential than the one used at the parameterization step of the mesh.

Figure 6:
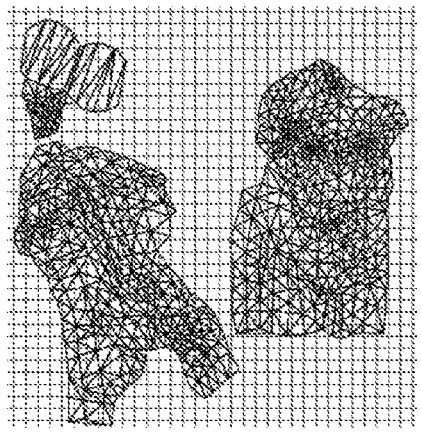
FIG. 6 shows an example of a regular grid provided in the (u, v) plane of FIG. 5.

FIG. 6 shows the parameterized 2D plane of FIG. 5 on which a grid has been added. In this example, the number of uniformly spaced horizontal and perpendicular lines has been selected so that the number of intersection is a bit larger than the number of vertices of the parameterized mesh.

Next, at step S50, the two-dimensional coordinates (u, v) of each vertex is modified. The modification is done by assigning one vertex to one intersection of the grid. This means that only one vertex can be placed on one intersection. Hence, two vertices cannot be assigned to one intersection. Assigning one vertex to one intersection may be called snapping: one intersection acts as a snap for one vertex.

Assigning means that one vertex is attached to one intersection, and this is performed by replacing the coordinate in the 2D plane of the vertex by the coordinate in the 2D plane of the intersection.

It is to be understood that a vertex of the parameterized mesh may have identical coordinate as an intersection before the step S50 is performed. In this case, the vertex's coordinate are kept unchanged.

At the end of the step S50, a grid in the 2D plane is obtained where any vertex of the initial mesh is assigned to a one different intersection. The grid is therefore equivalent to a 2D array of vertices.

Figure 3:
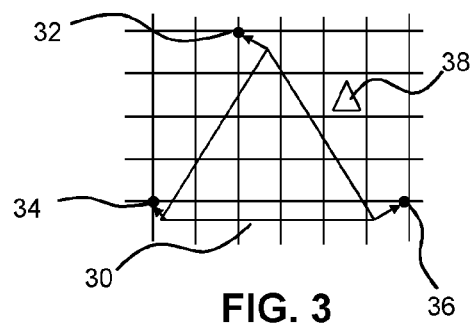
FIG. 3 shows an example of snapping one vertex with one intersection.

Referring now to FIG. 3, it is shown an example of snapping. Each one of the three vertices of a parameterized mesh (having here the shape of a triangle 30) is assigned to one intersection 32, 34, 36. The modification of the coordinates of each vertex may be contemplated as a displacement of said vertices, which is represented by arrows.

Interestingly, even if the parameterized mesh is small (for instance the triangle 38 that represents a small detail of the original 3D modeled object), the modification of the coordinates of the triangle 38 will be performed any, in as similar way as for the triangle 30. Hence, no detail of the initial polygonal mesh can disappear in the resulting two-dimensional array of vertices because the present method of compression does not rely on a sampling of the parameterized mesh of the prior art. Such a sampling method is shown on FIG. 2: the triangle 20 is sampled several times (represented by the black dots), while the small triangle 22 is not sampled because the sampling interval is too large. Hence, small details are lost.

In addition, the present invention decreases the quantity of data to be stored because only coordinates of the intersection on which vertices are assigned are to be kept in memory. On the contrary, sampling based method requires to store more points.

Figure 7:
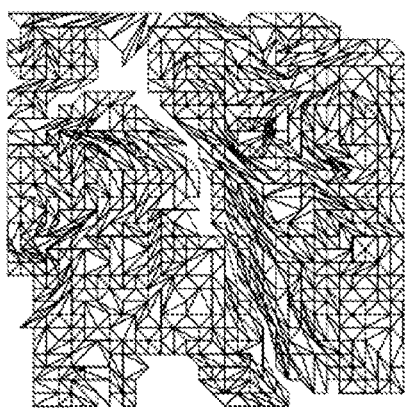
FIG. 7 shows an example of vertices of FIG. 5 snapped to the intersections of the regular grid of FIG. 6.

FIG. 7 shows the result of the modification of the 2D coordinates (u, v) of each vertex after that each vertex has been assigned to one different intersection of the grid. The vertices of the parameterized mesh have been reordered in such a way that a two-dimensional array is now formed.

Each vertex of the parameterized mesh has a coordinate (u, v) in the parameterization space, and so do the intersection of the grid. In this parameterization space some vertices may be concentrated in a specific area (more than 1 vertex between 4 intersections of the grid), leaving other regions of the grid with fewer vertices. Especially, the concentration may be problematic when there is more than one vertex per cell of the grid, a cell being the area comprised between 4 intersections of the grid. On the contrary, the some part of the 2D plane may have a smaller density of vertex (less than 1 vertex between 4 intersections of the grid). It is reminded that the number of grid intersections has been chosen to be close (and slightly bigger) than the number of vertices.

Figure 8:
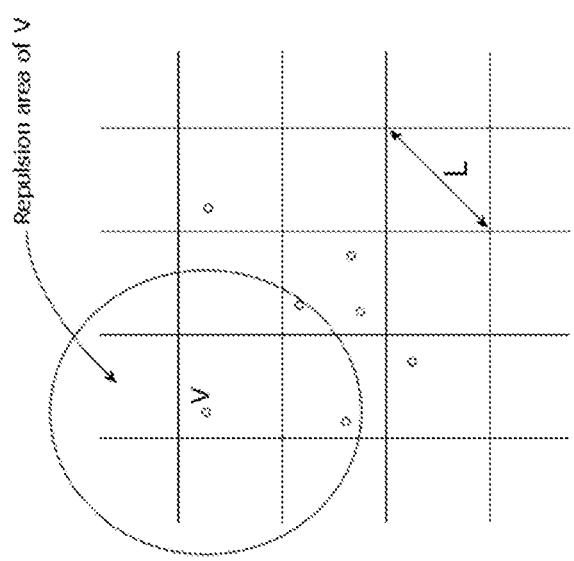
FIGS. 8 to 10 show an example of a repulsion technique that pushes each vertex away from another.

FIG. 8 shows a grid wherein the number of vertex (or vertices) on each cell of the grid varies.

To be able to assign easily one vertex to one intersection of the grid, a modification of vertex (u, v) coordinates may be required so that there is no more than one vertex between four intersections, that is, no more than one vertex per cell of the grid. If this condition is respected, then it is possible to assign each vertex to one of the four intersections that define a cell of the grid.

In the event a vertex is located on the frontier between two cells, (that is, the vertex is placed on the common edge connecting two common intersections of two cells), the decision to assign the vertex to one or the other of the two cells may be performed according to a predetermined rule. For instance, the rule may decide that the vertex located on the frontier is assigned to the cell having less vertices.

In the event a vertex is already located on an intersection of the grid, the 2D coordinate of the vertex is the same as the coordinate of the intersection, and the vertex is not moved in this case. Said otherwise, the 2D coordinate of a vertex located on an intersection is not modified when the step S50 is carried out.

Figure 9:
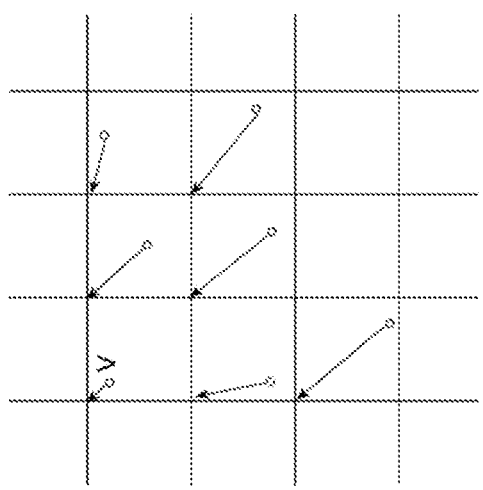
Figure 10:
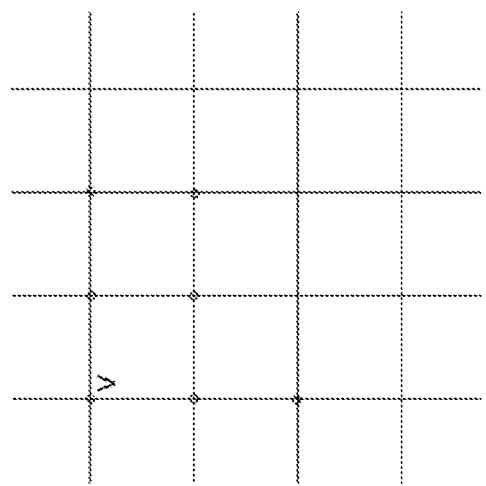

FIG. 9 illustrates the coordinates (u, v) of the vertices shown in FIG. 8 that have been modified so that there is only one vertex between four intersections of the grid. Therefore, each vertex of each cell of the grid can be assigned to the upper left intersection (amongst the 4 circling it). Hence, it is guaranteed that each vertex is assigned to a different intersection, as illustrated on FIG. 10.

Referring now to FIG. 1, it is now discussed an example of the attribution of one vertex to one intersection of the grid, the 2D coordinates of each vertex being modified as a result. In this example, one vertex is assigned to one intersection of the grid using a repulsion technique that pushes each vertex away from another in accordance with a criterion. The repulsion technique relies on a particle repulsion that simulates repulsion forces between vertices in the parameterization space. The criterion may be related to the force.

At step S500, the distance ($D_{V_x, V_y}$) between two vertices, namely Vx and Vy, is compared with the length (L) of the grid cell diagonal. One understands that the lines forming the grid are uniformly spaced horizontal and perpendicular lines, so that the intersections are regularly placed on the 2D plane and all the cells of the grid has a same cell diagonal length (L).

The term distance means a numerical description of how far apart vertices. The distance may be typically an Euclidien distance. Other types of distance may be used such as Manhattan distance or Chebyshev distance. A cell of the grid is the area comprised between 4 intersections of the grid.

In the event the evaluated distance between the two vertices is lower than the length (L) of the grid cell diagonal, the two vertices are pushed away from another, at step 520. The distance that is applied for pushing away two vertices may be defined as follows. A vertex noted A has n vertices $B_i$ in its neighborhood with distances $d_i$ that are lower than the length (L) of the grid cell diagonals. Each vertex $B_i$ adds a contribution $c_i$ for pushing away the point A. The contribution is defined by the relation $c_i=(L-d_i) \times u_i$ wherein $u_i$ is a unit vector providing a direction from B to A, that is, the direction with which the vertex A is pushed away from the vertex $B_i$. The vertex A pushed away of the vertex B with a distance $M=\lambda \times \eta \times \Sigma_{i=0}^{n} c_i$, wherein:

$\lambda$ is a factor initiated at 0 and progressively increasing to 1 for each iteration. The factor $\lambda$ advantageously provides a stability of the algorithm and avoids a dispersal of the vertices;

$\eta$ is a factor that limits the size of M in the event $\Sigma_{i=0}^{n} c_i$ is too large. $\eta$ advantageously avoids that one vertex jumps in one iteration from a cell to another one that is too far.

In the event the distance between the two vertices is greater than the length (L) of the grid cell diagonal, the two vertices are not spaced.

Several iterations of the repulsion technique are performed until there is at most only one vertex between four intersections of the grid, that is, one vertex per cell. This means that, for a given vertex, it is checked whether the distance with its neighbor(s) is larger than the length (L). In practice, the neighbors are selected in the cell wherein the vertex is located, and then the distance checking is carried out for vertices that are in cells surrounding the cell wherein the vertex is located. The cells surrounding a cell are the cells that share a common edge with this cell.

An example of a pseudo-algorithm for scanning the distance between the vertices of the cells and moving the vertices follows:

```
While there exists cells comprising two or more vertices
{
  For each cell of the grid
  {
    For each vertex A in the cell
    {
      If there exists a vertex B in the same cell or in a neighbor cell of
      the cell wherein the vertex is located with a distance from A < L
      {
        The contribution provided by B to push away A is
        registered; this is noted as being a collision between A and
        B;
      }
    }
  }
  According to the number of collisions discovered and the number of
  iterations of this algorithm, the value of λ is increased toward the
  value 1
  For each vertex A involved in a collision
  {
    The value of the distance M is computed
```

```
    The vetex A is moved of M in the 2D plane (possibly, and this is what
    is looking for, the vertex A changes of cell
    If vertices are out of the grid as a consequence of their displacement,
    the size of the grid is increase (for instance by adding lines and rows
    at the edges of the grid)
  }
}
```

Hence, at step S530, one vertex of the parameterized mesh has been assigned to on intersection of the grid using the repulsion technique performed using iteration. Iterations of the repulsion technique are performed until there is at most only one vertex between four intersections of the grid. The iteration advantageously allows to reduce the overall number of comparison to be performed is limited. In addition, the iteration guarantees that there is at most only one vertex between four grid intersections, and two vertices that were close before that step in the parameterization space are still close now: they are only separated by cells containing vertex that were in between them or cells containing no vertex.

As discussed in reference to step S40, the size of the grid may be dynamically changed (e.g. extended). It may be changed in response to the result of the repulsion technique: indeed, it generally results from the repulsion technique that points near the edge of the grid are pushed away outside the grid. In this case, new lines may be added on the edge of the grid close so that the pushed vertex (vertices) is always comprised between four intersections of the grid. As another example, the grid may have a hidden margin that comprises one or more intersections: the hidden intersections are unhidden and pushed away vertices can be assigned to the unhidden intersections.

At the end of step S50, the 2D coordinates of all the vertices of the parameterized mesh of the 3D modeled have been modified by assigning one vertex of the parameterized mesh to one intersection of the grid. A 2D array of vertices has obtained as a result of steps S10 to S50. The array contains vertices which were all in the initial polygonal mesh of the 3d modeled object. This array is equivalent to the initial polygonal mesh if the initial connectivity data to it. With the array and the connectivity data, it is possible to get back the initial polygonal mesh. The remeshing process is therefore a completely reversible process.

At step S60, empty intersections between vertices are eliminated. An empty intersection is an intersection that does not comprise any vertex. The elimination of empty intersection may be performed using a relaxation technique, as illustrated on FIGS. 11 and 12.

The relaxation step is typically performed after the particle repulsion step S500-S530. This relaxation step may use seem carving that is method origination from image processing. Seam carving is an algorithm for image resizing: it functions by establishing a number of seams that are paths of least importance in the 2D array of vertices. The algorithm automatically removes seams, and thus advantageously reduces size of the 2D array of vertices. Seam carving may also allow manually defining areas in which pixels may not be modified.

Seem carving iteratively removes seams of empty grid intersections of the 2D array so that vertices which are close on the object model and that were close on the grid before a seam removal stay close after the seam removal.

Figures 11, 12:
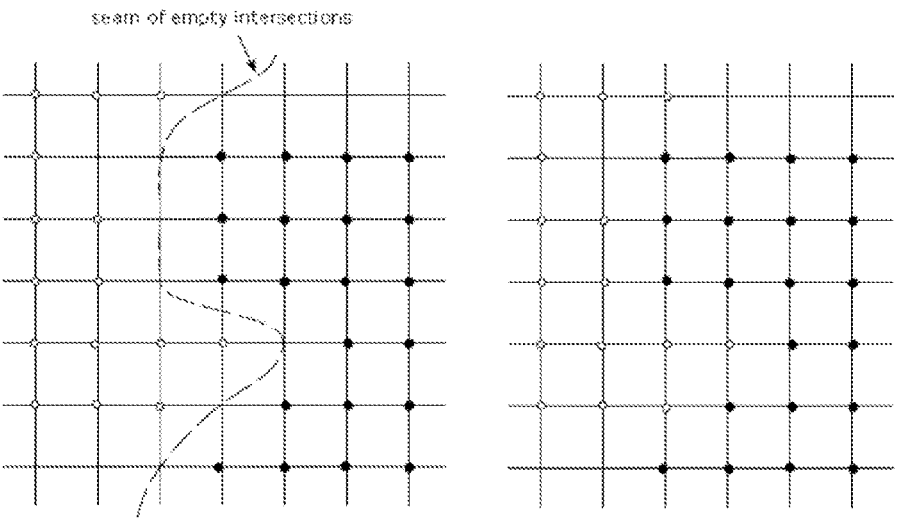
FIGS. 11 and 12 show an example of a relaxation technique that eliminates empty cells between vertices.

Referring now on FIG. 11, it is illustrated one iteration of the seam carving operation wherein a set of empty intersections has been determined in the 2D array of vertices obtained as a result of steps S10 to S50. White vertices and black vertices are separated by a seam of empty intersection.

Referring now to FIG. 12, it is illustrated the 2D array of vertices of FIG. 11 wherein the seam has been removed. The size of the 2D array has therefore been reduced. It is to be understood that some empty intersection may still be in the 2D array, even after that all the iterations of the relaxation step have been performed.

It is to be understood that the relaxation step may be performed with any algorithm able to identify empty intersections. Preferably, the algorithm should be able to maintain close vertices that are close in the parameterized mesh.

The output of step S60 is thus a 2D array of vertices of the parameterized mesh of the 3D modeled that has a reduced size compared to the 2D array taken in input.

In both steps S50 and S60, the set of vertices having modified 2D coordinates forms a raster image, wherein each vertex of the set is a pixel of the raster image and the coordinate (x, y, z) of each vertex of the set is stored in the color channels red/green/blue (RGB) of the raster image. Raster image means a dot matrix data structure representing a generally rectangular grid of pixels, e.g. a rectangular 2D array of vertices. The RGB color model is an additive color model in which red, green, and blue light are added together in various ways to reproduce a broad array of colors, as known in the art.

Interestingly, supplementary vertex properties (like normal per vertex, texture coordinates . . . ) may be stored as well in additional color channels. Hence, the raster image can possibly comprises all the properties of the initial mesh of the 3D modeled, being understood that the number of properties stored with each vertex is limited by the number of color channels.

Optionally, the raster image may be reframed for reducing the size of the raster image. This is performed, as known in the art.

Next, at step S80, a compression scheme is applied on the raster image and the connectivity data. The compression scheme may be based, but is not limited to, a discrete cosine transform such as JPEG format, a wavelet transformations such JPEG 2000 format. In fact, all the compression schemes that might be applied on a raster image can be used. Interestingly, since the 2D array of vertices raster image grid has been built so that vertices close in the grid are usually close on the surface of the initial object, x, y and z coordinates of adjacent vertices in the 2D array are strongly correlated; thus these compression schemes will achieve great results.

The connectivity data may be compressed with a compression scheme adapted to the format used for storing information relative to connectivity data. For instance, connectivity data may be stored in a text file, and the compression scheme may be, but is not limited to, ZIP compression, RAR compression.

Tools and operations dedicated to image processing (compression, video compression, watermarking, morphing . . . ) may be applied to the obtained raster image. The overall compression rate of the present invention is improved compared to known solution using geometry images, despite the presence of connectivity data. Indeed, less information needs to be stored because the remeshing of the present invention is independent of sampling points a number of sampling points.

A three-dimensional modeled compressed according to the present invention can be uncompressed using the following steps.

First, it is provided a set of vertices having modified two-dimensional coordinates. For instance, a 2D array of vertices obtained as a result of step S50 or S60, a raster image obtained as a result of step S70, a compressed raster image of step S80.

Next, the vertices are extracted from the provided set of vertices. The extraction may be typically performed by identifying the intersections of the 2D array. For instance, pixels of the raster image are identified.

Then, the extracted vertices are connected in accordance with connectivity data. The extracted vertices are placed in the 3D space. The coordinates of the extracted vertices may be obtained from the color channels RGB of the raster image.

The preferred embodiment of the present invention has been described. It will be understood that various modifications may be made without departing from the spirit and scope of the invention. Therefore, other implementations are within the scope of the following claims.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for compressing a three-dimensional modeled object, comprising:
   providing a mesh of the three-dimensional modeled object, the mesh having three-dimensional vertices;
   parameterizing (u,v) the mesh in a two-dimensional plane, the parameterization of the mesh resulting in a set of two-dimensional vertices having two-dimensional coordinates, any two-dimensional vertex of the set matching exactly a three-dimensional vertex of the mesh and reciprocally, any three-dimensional vertex of the mesh matching exactly a two-dimensional vertex of the set;
   providing a grid on the two-dimensional plane; and
   modifying the two-dimensional coordinates of each two-dimensional vertex in the set by assigning one two-dimensional vertex to one intersection of the two-dimensional grid.

2. The computer-implemented method of claim 1, further comprising, after providing the mesh of the three-dimensional modeled object:
   storing connectivity data of the mesh of the three-dimensional modeled object.

3. The computer-implemented method of claim 1, wherein assigning includes a repulsion technique that comprises:
   comparing distance between two vertices of the set of two-dimensional vertices with a length of a diagonal of a cell of the grid; and
   pushing the two vertices away if the distance between the two is lower than the length.

4. The computer-implemented method of claim 3, wherein several iterations of the repulsion technique are performed until there is at most only one two-dimensional vertex between four intersections of the grid.

5. The computer-implemented method of claim 3, further comprising, after performing the repulsion technique, performing a relaxation technique that eliminates empty intersections between vertices.

6. The computer-implemented method of claim 1, wherein size of the grid is extendable.

7. The computer-implemented method of claim 1, wherein the set of two-dimensional vertices having modified two-dimensional coordinates forms a raster image, wherein each two-dimensional vertex of the set is a pixel of the raster image and the coordinates of each two-dimensional vertex of the set is stored in color channels red/blue/green of the raster image.

8. The computer-implemented method of claim 7, wherein supplementary properties of the two-dimensional vertices of the set are stored in additional color channels.

9. The computer-implemented method of claim 7, wherein the raster image is reframed for reducing size of the raster image.

10. The computer-implemented method of claim 1, further comprising applying on the set of two-dimensional vertices having modified two-dimensional coordinates one of the following compression schemes:
   a discrete cosine transform; and
   a wavelet transformation.

11. The computer-implemented method of claim 10, further comprising: after providing the mesh of the three-dimensional modeled object, storing connectivity data of the mesh of the three-dimensional modeled object, wherein connectivity data of the mesh of the three-dimensional modeled object is compressed.

12. A computer-implemented method for uncompressing a three-dimensional modeled object compressed according to the method of claim 2, the method for uncompressing the three-dimensional modeled object comprising:
   providing the set of two-dimensional vertices having modified two-dimensional coordinates;
   extracting the vertices from the provided set of vertices; and
   connecting the extracted vertices with the connectivity data.

13. A computer-aided design system comprising:
   a database storing a mesh of a three-dimensional modeled object; and
   means for compressing the three-dimensional modeled object by:
      providing a mesh of the three-dimensional modeled object, the mesh having three-dimensional vertices;
      parameterizing (u,v) the mesh in a two-dimensional plane, the parameterization of the mesh resulting in a set of two-dimensional vertices having two-dimensional coordinates, any two-dimensional vertex of the set matching exactly a three-dimensional vertex of the mesh and reciprocally, any three-dimensional vertex of the mesh matching exactly a two-dimensional vertex of the set;
      providing a grid on the two-dimensional plane; and
      modifying the two-dimensional coordinates of each two-dimensional vertex in the set by assigning one two-dimensional vertex to one intersection of the two-dimensional grid.

14. The computer-aided design system as claimed in claim 13 further comprising means for storing, after providing the mesh of the three-dimensional modeled object, the storing means storing connectivity data of the mesh of the three-dimensional modeled object.

15. The computer-aided design system as claimed in claim 14 further comprising means for applying on the set of two-dimensional vertices having modified two-dimensional coordinates one of the following compression schemes: a discrete cosine transform and a wavelet transformation, wherein connectivity data of the mesh of the three-dimensional modeled object is compressed.

16. The computer-aided design system as claimed in claim 15 further comprising means for uncompressing the compressed three-dimensional modeled object by:
   providing the set of two-dimensional vertices having modified two-dimensional coordinates;
   extracting the vertices from the provided set of vertices; and
   connecting the extracted vertices with the connectivity data.

17. The computer-aided design system as claimed in claim 13, wherein size of the grid is extendable.

18. The computer-aided design system as claimed in claim 13, wherein the set of two-dimensional vertices having modified two-dimensional coordinates forms a raster image, wherein each two-dimensional vertex of the set is a pixel of the raster image and the coordinates of each two-dimensional vertex of the set is stored in color channels red/blue/green of the raster image.

19. A computer program product comprising:
   a non-transitory computer-readable medium comprising instructions for execution by a computer; and
   the instructions comprising program code causing the computer to:
      provide a mesh of a three-dimensional modeled object, the mesh having three-dimensional vertices;
      parameterize (u,v) the mesh in a two-dimensional plane, the parameterization of the mesh resulting in a set of two-dimensional vertices having two-dimensional coordinates, any two-dimensional vertex of the set matching exactly a three-dimensional vertex of the mesh and reciprocally, any three-dimensional vertex of the mesh matching exactly a two-dimensional vertex of the set;
      provide a grid on the two-dimensional plane; and
      modify the two-dimensional coordinates of each two-dimensional vertex in the set by assigning one two-dimensional vertex to one intersection of the two-dimensional grid.

* * * * *